US009337013B2

United States Patent
Fusegawa et al.

(10) Patent No.: US 9,337,013 B2
(45) Date of Patent: May 10, 2016

(54) SILICON WAFER AND METHOD FOR PRODUCING THE SAME

(75) Inventors: Izumi Fusegawa, Nishishirakawa (JP); Ryoji Hoshi, Nishishirakawa (JP); Susumu Sonokawa, Nishishirakawa (JP); Hisayuki Saito, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 43 days.

(21) Appl. No.: 14/122,356

(22) PCT Filed: May 14, 2012

(86) PCT No.: PCT/JP2012/003121
§ 371 (c)(1),
(2), (4) Date: Nov. 26, 2013

(87) PCT Pub. No.: WO2012/176370
PCT Pub. Date: Dec. 27, 2012

(65) Prior Publication Data
US 2014/0103492 A1    Apr. 17, 2014

(30) Foreign Application Priority Data
Jun. 20, 2011   (JP) .................. 2011-135891

(51) Int. Cl.
*C30B 15/00*   (2006.01)
*C30B 15/14*   (2006.01)
(Continued)

(52) U.S. Cl.
CPC .......... *H01L 21/02024* (2013.01); *C30B 15/00* (2013.01); *C30B 15/14* (2013.01);
(Continued)

(58) Field of Classification Search
CPC ................ H01L 21/02024; H01L 21/3221;
H01L 29/30; H01L 29/32; H01L 21/322;
C30B 29/06; C30B 33/00; C30B 33/02;
C30B 15/203; C30B 15/00; C30B 15/14;
C30B 15/20
USPC ............. 117/13, 106, 2, 3; 438/795, 471, 58, 438/143
See application file for complete search history.

(56) References Cited

U.S. PATENT DOCUMENTS 5,487,354 A    1/1996  Von Ammon et al.
2002/0185053 A1*  12/2002  Fei et al. .................... 117/2
(Continued)

FOREIGN PATENT DOCUMENTS

JP    A-6-56588     3/1994
JP    A-7-257991    10/1995
(Continued)

OTHER PUBLICATIONS

Ryuta et al., "Crystal-Originated Singularities on Si Wafer Surface After SC1 Cleaning," *Japanese Journal of Applied Physics*, Nov. 1990, vol. 29, No. 11, pp. L1947-L1949.
(Continued)

*Primary Examiner* — Galina Yushina
(74) *Attorney, Agent, or Firm* — Oliff PLC

(57) ABSTRACT

Methods for producing a silicon wafer from a defect-free silicon single crystal grown by a Czochralski (CZ) method are provided. The methods comprise: preparing a silicon wafer obtained by slicing the defect-free silicon single crystal and subjected to mirror-polishing; then performing a heat treatment step of subjecting the mirror-polished silicon wafer to heat treatment at a temperature of 500° C. or higher but 600° C. or lower for 4 hours or more but 6 hours or less; and performing a repolishing step of repolishing the silicon wafer after the heat treatment step such that a polishing amount becomes 1.5 μm or more. Therefore, it is an object to provide a method by which a silicon wafer can be produced at a high yield, the silicon wafer in which Light Point Defects (LPDs) are reduced to a minimum, the silicon wafer with a low failure-incidence rate in an inspection step and a shipment stage.

2 Claims, 3 Drawing Sheets

(a)

(b)

(51) Int. Cl.

| | | |
|---|---|---|
| *C30B 15/20* | (2006.01) | |
| *H01L 21/02* | (2006.01) | |
| *H01L 21/322* | (2006.01) | |
| *H01L 29/30* | (2006.01) | |
| *C30B 29/06* | (2006.01) | |
| *C30B 33/00* | (2006.01) | |
| *C30B 33/02* | (2006.01) | |
| *H01L 29/34* | (2006.01) | |

(52) U.S. Cl.
CPC .............. *C30B 15/203* (2013.01); *C30B 29/06* (2013.01); *C30B 33/00* (2013.01); *C30B 33/02* (2013.01); *H01L 21/3221* (2013.01); *H01L 29/30* (2013.01); *C30B 15/20* (2013.01); *H01L 29/34* (2013.01)

(56) References Cited

U.S. PATENT DOCUMENTS

| | | | | |
|---|---|---|---|---|
| 2007/0295265 | A1* | 12/2007 | Kimura | 117/2 |
| 2009/0226736 | A1* | 9/2009 | Kurita et al. | 428/446 |
| 2012/0043644 | A1* | 2/2012 | Ono et al. | 257/607 |
| 2012/0080775 | A1 | 4/2012 | Matsuda et al. | |

FOREIGN PATENT DOCUMENTS

| | | | | |
|---|---|---|---|---|
| JP | 09-064052 | * | 3/1997 | ............ H01L 21/322 |
| JP | A-9-64052 | | 3/1997 | |
| JP | A-2006-4983 | | 1/2006 | |
| JP | A-2011-14645 | | 1/2011 | |
| WO | WO 2010/140671 A1 | | 12/2010 | |

OTHER PUBLICATIONS

Hourai et al., "Control of Grown-in Defects in Si Crystal Growth," *The Japanese Association for Crystal Growth*, 1998, vol. 25, No. 5, pp. 17-23 (with abstract).

Itsumi et al., "The Composition of Octahedron Structures that Act as an Origin of Defects in Thermal $SiO_2$ on Czochralski Silicon," *J. Appl., Phys.*, Nov. 1995, vol. 78, No, 10, pp. 5984-5988.

*Saishin Silicon Device to Kessho Gijutsu*, Realize Science & Engineering, Dec. 26, 2005, pp. 166-178.

*ULSI Seizo No Tame No Bunseki Handbook*, Realize Inc., Jul. 29, 1994, pp. 112-125.

International Search Report issued in International Patent Application No. PCT/JP2012/003121 dated Aug. 7, 2012.

International Preliminary Report on Patentability issued in International Patent Application No. PCT/JP2012/003121 dated Dec. 23, 2013.

Aug. 12, 2014 Office Action issued in Japanese Application No. 2011-135891 (with partial translation).

* cited by examiner (a)

(b)

0.68 μm (a)

(b)

0.68 μm 0.68 μm (a)          (b)

0.68 μm (a)　　　　　　　　　　(b)

(a)　　　　　　　　　　(b)

(a)　　　　　　　　　　(b)

SILICON WAFER AND METHOD FOR PRODUCING THE SAME

TECHNICAL FIELD

The present invention relates to a silicon wafer in which LPDs (Light Point Defects) on the surface thereof are reduced to a minimum and a method far producing the silicon wafer.

BACKGROUND ART

For a silicon wafer used as a material for producing a semiconductor device, a substrate obtained by slicing a silicon single crystal grown by the Czochralski (CZ) method, in particular, the Magnetic field applied Czochralski (MCZ) method that produces a crystal while applying a magnetic field, the substrate with a polished surface, is used. In recent years, a wafer without slight projections and depressions has been required as the quality of the surface of such a wafer as the design rules in the production of the semiconductor device have become finer. This has become an increasingly important quality item for monitoring a break by slight projections and depressions and a foreign substance in a device production step because the size of wiring in device production has become finer. For evaluation of the quality of such a silicon wafer surface, a laser particle counter is used, and the detection size of a particle has increasingly become finer and has become 45 nm or less as the design rules of the device have become finer. Therefore, preventing a micro defect caused by processing in a mirror processing (polishing) step of a wafer surface and a minute foreign substance and impurity in wafer cleaning which is a post-step of the mirror-like finishing (polishing) step has been performed.

On the other hand, it is well known that, when a COP (Non-patent Literature 1) is present on the silicon wafer surface as a crystal defect and a concave indentation is formed on the wafer surface, this is measured as an LPD by a laser particle counter. That is, what is not an actual foreign substance is sometimes detected as a particle. It has been reported that these crystal defects are formed in accordance with a temperature gradient (G) and a growth rate (V) during crystal growth (Non-patent Literature 2). Moreover, a production method in which these G and V are controlled, for example, in Patent Literature 1, a method for controlling the formation of a crystal defect by reducing the growth rate of a silicon single crystal has been reported. Furthermore, in Patent Literature 2, it has been reported that a defect-free crystal containing practically no COP can be obtained by pulling a single crystal at a rate (V) that does not exceed the maximum pulling rate of a single crystal that is approximately proportional to a temperature gradient (G) in a boundary region between a solid phase/a liquid phase of a silicon single crystal.

Moreover, it is also disclosed that, in a step of mirror processing a wafer, a PID (Polished Induced Defect) formed as the effect of a residue at the time of polishing is detected as an LPD of a silicon wafer (Patent Literature 3). It has been reported that the LPD (PID) caused thereby is improved by a chemical solution used at the time of polishing and by a cleaning step.

However, even a silicon wafer obtained by slicing a defect-free silicon single crystal in which no COP is present, the defect-free silicon single crystal grown by such a production method as disclosed in Patent Literature 2, the silicon wafer produced by a step in which a PID in the polishing step is not generated, when the detection size of a particle is made finer and is set at 45 nm in a laser particle counter, an LPD is sometimes detected. That is, even in a wafer with a wafer surface in which no foreign substance is actually present, the wafer in which neither COP nor PID is present, when the detection size in particle measurement is made finer and then a quality inspection is performed, LPDs may be detected in high density, the wafer may be judged to be a failure in an inspection step and a shipment stage of the wafer, and yields may be reduced.

CITATION LIST

Patent Literatures

Patent Literature 1: Japanese Unexamined Patent Publication (Kokai) No. H6-56588
Patent Literature 2: Japanese Unexamined Patent Publication (Kokai) No. H7-257991
Patent Literature 3: WO2010/140671 A1
Patent Literature 4: Japanese Unexamined Patent Publication (Kokai) No. 119-64052
Non-patent Literature 1: Jpn. J. Appl. Phys., 29 (1990), L1947-L1949
Non-patent Literature 2: The Japanese Association for Crystal Growth vol. 25 No. 5, (1998)
Non-patent Literature 3: J. Appl. Phys., 78 (1995) P5984-5988
Non-patent Literature 4: Saishin Silicon Device to Kessho Gijutsu, Realize Science & Engineering Center Co., Ltd., Dec. 26, 2005, P. 171
Non-patent Literature 5: ULSI Seizo no tame no Bunseki Handbook, Realize Inc., Jul. 29, 1994, P. 115

DISCLOSURE OF INVENTION

Problem to be Solved by the Invention

It has been reported that a cause of formation of these micro LPDs is heavy-metal contamination of a wafer. For example, typical heavy-metal contamination is contamination by copper (Cu) and occurs in a polishing step, a cleaning step, a heat treatment step, or the like by which a wafer is produced. The copper contamination easily occurs because the rate of diffusion of copper is faster than those of other heavy metals. Therefore, it has been reported that the copper contamination can be avoided by cleaning a silicon wafer after performing heat treatment thereon at 600° C. or lower (Patent Literature 4). For such cleaning of the surface of a wafer, for example, an HF solution, an $HF/H_2O_2$ solution, an HCl solution, an $HCl/H_2O_2$ solution, an HCl/HF solution, an SC1 solution, an $H_2SO_4/H_2O_2$ solution, and the like are used. It has been disclosed that heavy metals are reduced by these treatment.

However, even in a wafer produced by adequately controlling heavy-metal contamination in a wafer production step, there are still sometimes a large number of LPDs. Moreover, in such a wafer, there are cases that the LPDs can not be reduced even when cleaning is performed after heat treatment at 600° C. or lower, the wafer is judged to be a failure in an inspection step and a shipment stage of the wafer, and yields are reduced. Furthermore, if there is contamination by a tiny amount of heavy metal during silicon single crystal growth, as described in Patent Literature 4, LPDs continuously increase even when a wafer is cleaned after heat treatment, and it is impossible to reduce the LPDs.

The present invention has been made in view of the above-described problems, and an object thereof is to provide a method for producing a silicon wafer from a defect-free silicon single crystal grown by the CZ method, the method by which a silicon wafer in which micro LPDs are reduced to a minimum, the silicon wafer with a low failure-incidence rate in an inspection step and a shipment stage, can be produced at a high yield, and to provide a silicon wafer produced by the method, the silicon wafer which is a high-quality silicon wafer in which LPDs are reduced to a minimum when measurement is performed by a particle counter.

Means for Solving the Problems

The present invention provides a method for producing a silicon wafer from a defect-free silicon single crystal grown by a CZ method, the method comprising: preparing a silicon wafer obtained by slicing the defect-free silicon single crystal and subjected to mirror-polishing; then performing a heat treatment step of subjecting the mirror-polished silicon wafer to heat treatment at a temperature of 500° C. or higher but 600° C. or lower for 4 hours or more but 6 hours or less; and performing a repolishing step of repolishing the silicon wafer after the heat treatment step such that a polishing amount becomes 1.5 µm or more.

As described above, by performing the relatively low-temperature heat treatment step by using the fact that the rates of diffusion of heavy metals, in particular, Cu and Ni, in a silicon single crystal are fast, it is possible to make the heavy metals which become a cause of LPDs gather near the surface of the silicon wafer subjected to mirror-polishing. Subsequently, by removing the heavy metals by the repolishing step, it is possible to reduce LPDs. As a result, a method for producing a silicon wafer is provided, the method by which a silicon wafer can be produced at a high yield, the silicon wafer in which LPDs are reduced to a minimum, the silicon wafer with a low failure-incidence rate in an inspection step and a shipment stage, even when the defect-free silicon single crystal is contaminated with heavy metals at the time of growth.

In particular, the method of the present invention for producing a silicon wafer can reduce micro LPDs that are about 45 nm in size to a minimum, the LPDs that were not able to be removed in the past, irrespective of the type of heavy metal which becomes a cause of LPDs.

Moreover, it is possible that by performing the heat treatment step and the repolishing step, the silicon wafer in which the number of LPDs that are 37 nm or more but 120 nm or less in particle diameter size, the LPDs detected by a particle counter, is 10/wafer or less is produced.

When micro LPDs are reduced as described above, a method for producing a silicon wafer is provided, the method by which a silicon wafer can be produced at a high yield, the silicon wafer with a lower failure-incidence rate in the inspection step and the shipment stage.

Furthermore, it is preferable that, as the silicon wafer obtained by slicing and subjected to mirror-polishing, a silicon wafer of 300 mm or more in diameter is prepared.

By performing the heat treatment step and the repolishing step in such a large-diameter wafer used as a wafer for a leading-edge product, it is possible to produce a silicon wafer in which micro LPDs are reliably reduced.

Moreover, a silicon wafer produced by the method for producing a silicon wafer is provided.

Such a silicon wafer is a silicon wafer best suited for production of a wafer for step checking that is used in a semiconductor device fabrication step and production of a high-integration semiconductor device because, even when a base defect-free silicon single crystal is contaminated with heavy metals at the time of growth, LPDs are reduced to a minimum and the failure-incidence rate in the inspection step and the shipment stage is low.

Furthermore, the present invention provides a silicon wafer that is obtained by performing heat treatment on a mirror-polished silicon wafer and performing repolishing thereon, wherein the number of LPDs that are 37 nm or more but 120 nm or less in particle diameter size, the LPDs detected by a particle counter, is 10/wafer or less.

In such a silicon wafer, the failure-incidence rate in the inspection step and the shipment stage is low because the LPDs are reduced to a minimum; therefore, such a silicon wafer is a silicon wafer suited for production of a wafer for step checking that is used in a semiconductor device fabrication step and production of a high-integration semiconductor device.

Moreover, it is preferable that a diameter of the silicon wafer is 300 mm or more.

Such a large-diameter wafer used as a wafer for a leading-edge product is a silicon wafer best suited for production of a wafer for step checking that is used in the more-advanced semiconductor device fabrication step and production of a high-integration semiconductor device.

Effect of the Invention

As described above, since the method of the present invention for producing a silicon wafer can reduce LPDs by making heavy metals which become a cause of LPDs gather near the surface of a silicon wafer subjected to mirror-polishing by performing the heat treatment step and removing the heavy metals by the repolishing step. Therefore, the method is a method by which a silicon wafer can be produced at a high yield, the silicon wafer in which the LPDs are reduced to a minimum, the silicon wafer with a low failure-incidence rate in the inspection step and the shipment stage, even when a defect-free silicon single crystal is contaminated with heavy metals at the time of growth.

In particular, according to the method of the present invention for producing a silicon wafer, it is possible to reduce micro LPDs that are caused by heavy metals and are about 45 nm in size, the micro LPDs that were not able to be removed in the past, to a minimum.

Moreover, with the silicon wafer of the present invention, it is possible to provide a high-quality silicon wafer in which LPDs are reduced to a minimum when measurement is performed by a particle counter, the silicon wafer best suited for production of a wafer for step checking that is used in a semiconductor device fabrication step and production of a high-integration semiconductor device.

BEST MODE FOR CARRYING OUT THE INVENTION

Hereinafter, the present invention will be described in more detail, but the present invention is not limited thereto. As described earlier, even in a silicon wafer obtained by slicing a defect-free silicon single crystal in which no COP is present, the silicon wafer produced through a step in which a PID in a polishing step is not generated, when the detection size is reduced in a particle counter, LPDs caused by heavy metals are detected in high density, which becomes a problem, and the difficulty of removing these LPDs becomes a problem. Therefore, the development of a method for producing a silicon wafer, the method that can reduce LPDs caused by heavy metals to a minimum, and the development of a silicon wafer in which LPDs are reduced to a minimum have been sought after.

As described above, through an intensive study, the inventors of the present invention have found out that a cause of formation of LPDs in a silicon wafer obtained by slicing a defect-free silicon single crystal is a tiny amount of heavy metal mixed into the defect-free silicon single crystal while the defect-free silicon single crystal was being pulled, in particular, Cu and Ni. They gather by a thermal history during the production of a silicon single crystal and grow into a minute size. The inventors of the present invention have found out that, in a polishing step, Cu is selectively etched and forms a minute pit and Ni is etched more slowly and forms a minute hillock (a convex shape), and these shapes are detected as LPDs by a laser particle counter. Then, the inventors of the present invention have found out that, by performing a relatively low-temperature heat treatment step, it is possible to make Cu and Ni gather near the surface of a silicon wafer subjected to mirror-polishing and reduce LPDs by removing them by a repolishing step, and completed the present invention. The detailed description will be given below.

Experimental Example 1

First, to determine a cause of generation of LPDs, a defect-free silicon single crystal of 300 mm in diameter was grown by filling a quartz crucible of 810 mm in diameter with 410 kg of polycrystalline silicon, melting the polycrystalline silicon, and then controlling a temperature gradient (G) and a growth rate (V) in a boundary region between a solid phase/a liquid phase of silicon as disclosed in Patent Literature 2. In doing so, boron doping was performed so that the resistivity became 10 $\Omega \cdot cm$, and the crystal axis orientation was set at <100>. Slicing, lapping, etching, mirror-polishing, and the like which were industrially generally applied were performed on this defect-free silicon single crystal, whereby a mirror-polished wafer I was produced. This mirror-polished wafer I was measured by a particle counter (KLA-Tencor Corporation Model name=SP2 Detection particle diameter size: 0.037 µm or more). The detection result of an LPD map in a wafer plane is depicted in FIG. 1(a).

Figure 1:
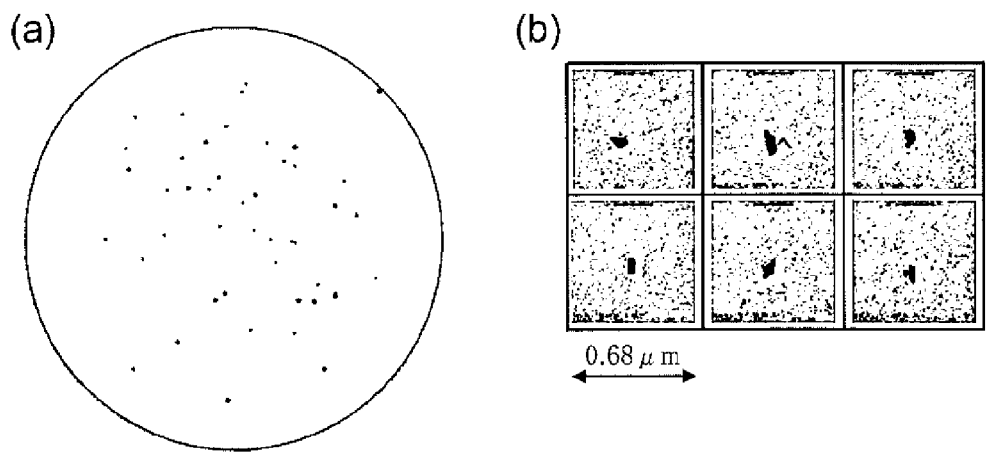
FIG. 1(a) is an LPD map of a mirror-polished wafer I of Experimental Example 1 and FIG. 1(b) is an LPD shape of the mirror-polished wafer I of Experimental Example 1.

As depicted in FIG. 1(a), even though it was the silicon wafer obtained by slicing the defect-free silicon single crystal, LPDs were detected. Therefore, to examine the actual state of the LPDs thus detected, the surface of the mirror-polished wafer I was observed by using a scanning electron microscope (SEM). Six observation results of typical defect shapes thus observed are depicted in FIG. 1(b). As depicted in FIG. 1(b), it was revealed that the observed LPD shapes were pit-shaped defects.

Experimental Example 2

Figure 2:
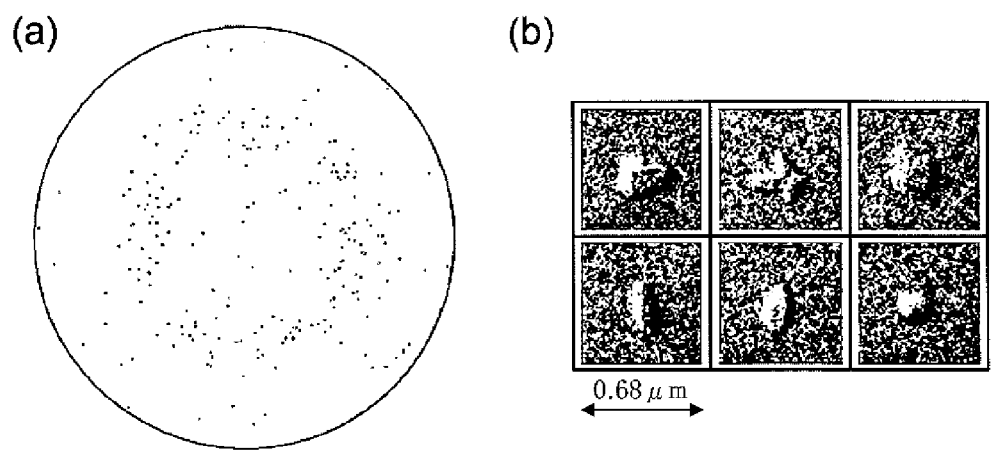
FIG. 2(a) is an LPD map of a mirror-polished wafer II of Experimental Example 2 and FIG. 2(b) is an LPD shape of the mirror-polished wafer II of Experimental Example 2.

Next, a mirror-polished wafer II was produced from a defect-free silicon single crystal produced with a different quartz crucible in the same manner as in Experimental Example 1 described above, and LPDs were examined. A detected LPD map in a wafer plane is depicted in FIG. 2(a), and the observation results of the surface of the mirror-polished wafer II, the observation results obtained by the SEM, are depicted in FIG. 2(b). As depicted in FIG. 2(a), it was confirmed that LPDs were generated on the surface of the mirror-polished wafer II. Moreover, as depicted in FIG. 2(b), it was revealed that the shapes of the LPDs thus detected were convex hillocks. This difference in shape revealed that a cause of formation of LPDs in the mirror-polished wafer II was different from that of the mirror-polished wafer I.

Experimental Example 3

The Shape of a COP

Figure 3:
FIG. 3 is a COP shape of a mirror-polished wafer III of Experimental Example 3.

It is known that a crystal defect is detected as an LPD. It has been reported that a COP (Crystal Originated Particle) is detected as an octahedral void defect (Non-patent Literature 3). To check if the defect shapes detected in the mirror-polished wafers I and II were related to the COP, a silicon single crystal of 300 mm in diameter was grown by doubling the crystal growth rate so that the COP was generated. Other growth conditions were the same as those of Experimental Example 1. The result obtained by observing the shape of an LPD of a mirror-polished wafer III by the SEM, the mirror-polished wafer III obtained by slicing this silicon single crystal and subjected to mirror-polishing, is depicted in FIG. 3. As depicted in FIG. 3, a defect caused by the COP was a void defect called what is termed a twin pit which is two partially-overlapping defects whose one side is surrounded in a [110] direction. This revealed that the defects of the mirror-polished wafers I and II were obviously different from the COP.

This twin pit was observed in any of the wafers obtained by slicing the silicon single crystals grown by increasing the growth rate in Experimental Example 1 and Experimental Example 2. This also revealed that the defects of the mirror-polished wafers I and II were different from the COP.

Experimental Example 4

The Shape of a PID

Figure 4:
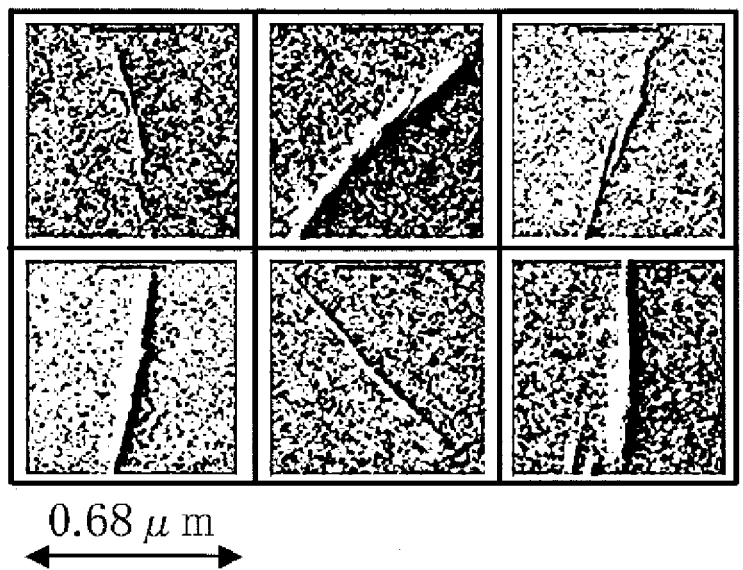
FIG. 4 is a PID shape of a mirror-polished wafer IV of Experimental Example 4.

It is known that an LPD is also formed by a mirror-polishing step. A defect formed particularly by the mirror-polishing step is called a PID (Polished Induced Defect) and is markedly detected in a defect-free silicon wafer (Non-patent Literature 4). Moreover, Patent Literature 3 discloses that the PID is formed by a residue at the time of mirror-polishing. To check if the defect shapes detected in the mirror-polished wafers I and II were related to the PID, a wafer obtained by slicing a defect-free silicon single crystal as depicted in Experimental Example 1 and Experimental Example 2 was selected in advance and polishing was performed by intentionally mixing Ni and Cu during a commonly-performed mirror-polishing step, whereby a mirror-polished wafer IV was obtained. The observation results of the typical PIDs formed in the mirror-polished wafer IV, the observation results obtained by the SEM, are depicted in FIG. 4. As depicted in FIG. 4, the PIDs were shaped like thin and long lines. This revealed that the defects of the mirror-polished wafers I and II were obviously different from the PID.

Experimental Example 5

Repolishing of the Mirror-Polished Wafer I

Figure 5:
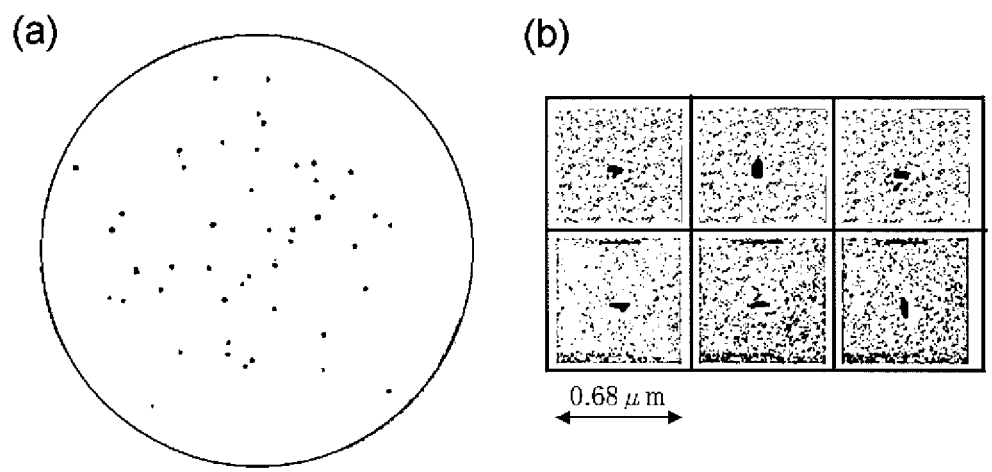
FIG. 5(a) is an LPD map of a mirror-polished wafer V of Experimental Example 5 and FIG. 5(b) is an LPD shape of the mirror-polished wafer V of Experimental Example 5.

As the detailed shape observation by the SEM, the LPD formed in the mirror-polished wafer I of Experimental Example 1 is obviously different from the void defect (COP) described in Experimental Example 3. Moreover, it has a defect shape different from the PID due to the influence of the polishing step described in Experimental Example 4. Furthermore, to check the influence of the polishing step on the LPD again, the mirror-polished wafer I was repolished to obtain a mirror-polished wafer V, and an LPD of the mirror-polished wafer V was measured again. In repolishing, the amount of polishing was set at 1.5 μm. An LPD map after repolishing is depicted in FIG. 5(a), and the check results of the shape of the LPD by the SEM are depicted in FIG. 5(b). As depicted in FIGS. 5(a) and 5(b), in the mirror-polished wafer V, a pit-shaped defect having no regular shape which was the same as that of the mirror-polished wafer I was observed, and it was confirmed that this pit-shaped defect was not caused by the polishing step.

Experimental Example 6

Repolishing of the Mirror-Polished Wafer II

Figure 6:
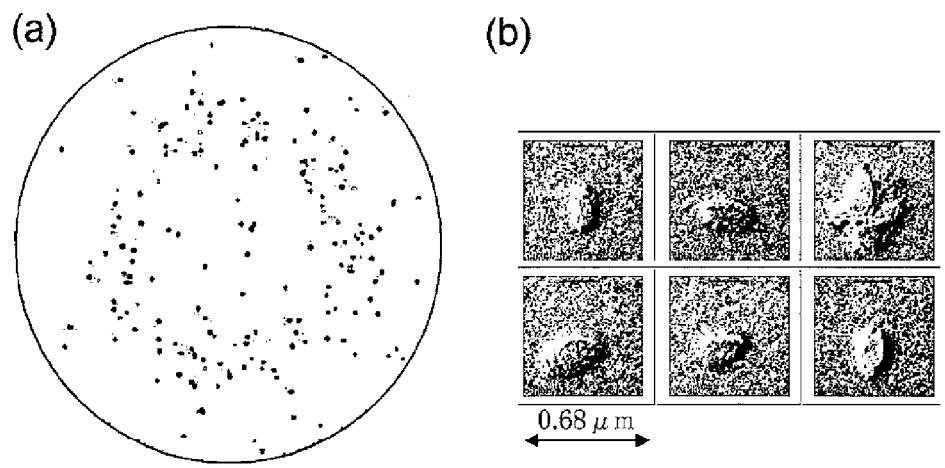
FIG. 6(a) is an LPD map of a mirror-polished wafer VI of Experimental Example 6 and FIG. 6(b) is an LPD shape of the mirror-polished wafer VI of Experimental Example 6.

As the detailed shape observation by the SEM, the LPD formed in the mirror-polished wafer II of Experimental Example 2 is obviously different from the void defect (COP) described in Experimental Example 3. Moreover, it has a defect shape different from the PID due to the influence of the polishing step described in Experimental Example 4. As in the case with Experimental Example 5, to check the influence of the polishing step on the LPD again, the mirror-polished wafer II was repolished to obtain a mirror-polished wafer VI, and an LPD of the mirror-polished wafer VI was measured again. In repolishing, the amount of polishing was set at 1.5 μm. An LPD map after repolishing is depicted in FIG. 6(a), and the check results of the defect shape by the SEM are depicted in FIG. 6(b). As depicted in FIGS. 6(a) and 6(b), in the mirror-polished wafer VI, a convex hillock having no regular shape which was the same as that of the mirror-polished wafer II was observed. As a result, it was confirmed that the LPD defect of the mirror-polished wafer II was not caused by the polishing method.

[Impurity Measurement of the Mirror-Polished Wafer I]

It was confirmed that the pit-shaped LPD was not a defect caused by the polishing step since the same defect shape was observed even after repolishing. To conduct a further examination of a cause of formation of the defect, impurity measurement was performed on the mirror-polished wafer I of Experimental Example 1. The measurement method was the WSA (Wafer Surface Analysis) (Non-patent Literature 5) method commonly used in the impurity measurement of the wafer surface, and the recovered liquid containing impurities was detected by inductively coupled plasma-mass spectrometry (ICP-MS). As a result of the analysis of the mirror-polished wafer I of Experimental Example 1, the impurities were below measurable limits. Therefore, heat treatment was performed to move the bulk impurities to the wafer surface. The heat treatment atmosphere was a nitrogen atmosphere, the heat treatment temperature was set at 1000° C., and the time was set at 60 minutes. The impurity measurement was performed again by the WSA method on the mirror-polished wafer I subjected to the heat treatment, and the results obtained by comparison with a normal product are listed in Table 1. Among various heavy-metal impurities, the detected concentration of Cu was about an order of magnitude higher than the detected densities of others. In Table 1, ND indicates that the concentration was below measurable limits.

TABLE 1

| | Wafer surface impurity concentration (A × $10^{10}$ atoms/cm$^2$) | | | | | | | | | | |
|---|---|---|---|---|---|---|---|---|---|---|---|
| Elements | Al | Na | Fe | Cr | Cu | Ni | Zn | Mg | Ti | Mn | W |
| Ref. (normal product) | 0.005 | ND | ND | ND | 0.02 | ND | ND | ND | 0.009 | ND | ND |
| Mirror-polished wafer I | 0.006 | ND | ND | ND | 0.119 | ND | ND | ND | 0.008 | ND | ND |

[Impurity Measurement of the Mirror-Polished Wafer II]

The defect observed by the SEM in the mirror-polished wafer II of Experimental Example 2 had a shape completely different from those of the COP, the PID, and the LPD of the mirror-polished wafer I of Experimental Example 1. Therefore, after heat treatment was performed on the mirror-polished wafer II in a manner similar to that described above at 1000° C. for 60 minutes, the impurity analysis by the WSA method was conducted. The analysis results are listed in Table 2. Table 2 reveals that the Ni concentration is high among various heavy-metal impurities. In Table 2, ND indicates that the concentration was below measurable limits.

TABLE 2

| | Wafer surface impurity concentration (A × $10^{10}$ atoms/cm$^2$) | | | | | | | | | | |
|---|---|---|---|---|---|---|---|---|---|---|---|
| Elements | Al | Na | Fe | Cr | Cu | Ni | Zn | Mg | Ti | Mn | W |
| Ref. (normal product) | 0.005 | ND | ND | ND | 0.02 | ND | ND | ND | 0.009 | ND | ND |

TABLE 2-continued

| | Wafer surface impurity concentration (A × $10^{10}$ atoms/cm$^2$) | | | | | | | | | |
|---|---|---|---|---|---|---|---|---|---|---|
| Elements | Al | Na | Fe | Cr | Cu | Ni | Zn | Mg | Ti | Mn | W |
| Mirror-polished wafer II | 0.008 | ND | ND | ND | 0.018 | 0.026 | ND | ND | 0.008 | ND | ND |

Experimental Example 7

Heat Treatment and Repolishing of the Mirror-Polished Wafer I

It was confirmed that cause of the LPD of the mirror-polished wafer I of Experimental Example 1 was neither COP nor PID. However, when measurement was performed by the particle counter, a micro pit-shaped defect was formed, and the Cu concentration in this wafer was higher than normal. Based on the above results, the pit-shaped defect was thought to have been caused by a tiny amount of Cu mixed at the time of silicon single crystal growth, and Cu was thought to have agglomerated and formed a defect by a thermal history during the crystal growth.

Figure 7:
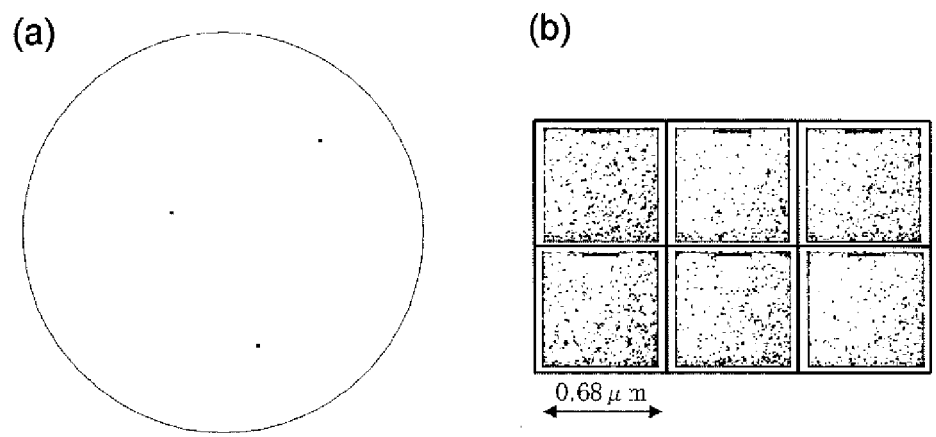
FIG. 7(a) is an LPD map of a mirror-polished wafer VII of Experimental Example 7 and FIG. 7(b) is an LPD shape of the mirror-polished wafer VII of Experimental Example 7.

Thus, a method for improving the LPD of the mirror-polished wafer I by making Cu agglomerate on the surface of the mirror-polished wafer I with heat treatment since the rate of diffusion of Cu in silicon is fast and by polishing it is possible. Heat treatment was performed on the mirror-polished wafer I of Experimental Example 1 in a nitrogen atmosphere at 500° C. for 6 hours. Then, the surface was repolished by 1.5 μm, whereby a mirror-polished wafer VII was produced, and LPD measurement was performed by the particle counter. The LPD measurement result at this time is depicted in FIG. 7(a), and the defect observation results by the SEM are depicted in FIG. 7(b). FIG. 7(a) reveals that the LPDs were greatly reduced as compared to FIG. 1(a). Moreover, as depicted in FIG. 7(b), it was confirmed that the pit defect disappeared. That is, it was found out that the pit-shaped LPD detected in the mirror-polished wafer I was caused by a tiny amount of Cu mixed during the silicon single crystal growth.

Experimental Example 8

Heat Treatment and Repolishing of the Mirror-Polished Wafer II

Likewise, it was confirmed that cause of the LPD of the mirror-polished wafer II of Experimental Example 2 was neither COP nor PID. However, when measurement was performed by the particle counter, a micro hillock-shaped defect was formed, and the Ni concentration in this wafer was higher than normal. Based on the above results, the hillock-shaped defect was thought to have been caused by a tiny amount of Ni mixed at the time of silicon single crystal growth, and Ni was thought to have agglomerated and formed a defect by a thermal history during the crystal growth.

Figure 8:
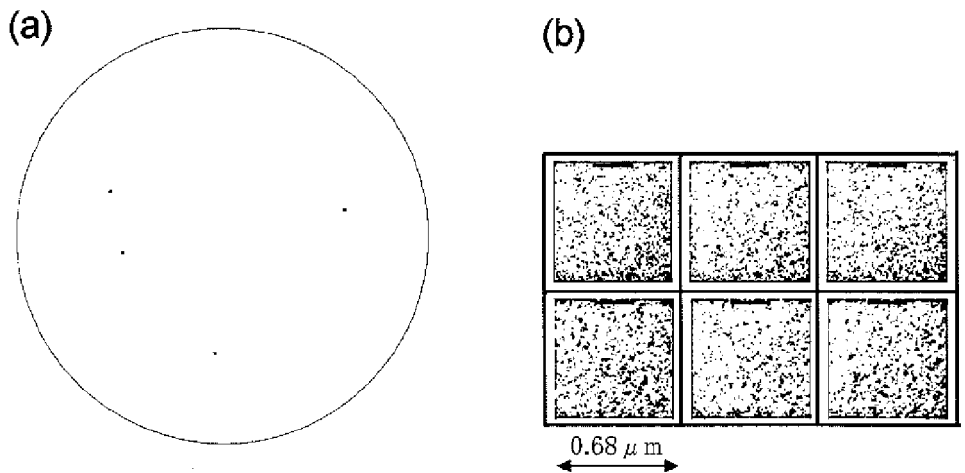
FIG. 8(a) is an LPD map of a mirror-polished wafer VIII of Experimental Example 8 and FIG. 8(b) is an LPD shape of the mirror-polished wafer VIII of Experimental Example 8.

Therefore, heat treatment was performed in the same manner as in Experimental Example 7 on the silicon wafer described in Experimental Example 2 in a nitrogen atmosphere at 500° C. for 6 hours. Then, the surface was repolished by 1.5 μm, whereby a mirror-polished wafer VIII was produced, and LPD measurement was performed by the particle counter. The LPD measurement result is depicted in FIG. 8(a), and the defect observation results by the SEM are depicted in FIG. 8(b). As depicted in FIG. 8(a), the LPDs were greatly reduced as compared to FIG. 2(a). Moreover, FIG. 8(b) reveals that the hillock-shaped defect disappeared. That is, it was found out that the hillock-shaped LPD detected in the mirror-polished wafer II was caused by a tiny amount of Ni mixed during the silicon single crystal growth.

Experimental Example 9

The LPD Reduction Effect when the Heat Treatment Temperature is Varied

With Experimental Example 7 and Experimental Example 8, it was confirmed that the LPDs caused by a tiny amount of heavy-metal impurity (in particular, Cu and Ni) mixed during the silicon single crystal growth can be reduced by performing heat treatment on the wafer and performing repolishing. Thus, the LPD reduction effect when the heat treatment temperature was varied was checked by using the mirror-polished wafers of Experimental Example 1 and Experimental Example 2. The heat treatment time was set at 4 hours, the amount of repolishing was set at 1.5 μm, and the heat treatment temperature was set at four levels: 400° C., 500° C., 600° C., and 700° C. The results of measurement of the number of LPDs of the mirror-polished wafers after the heat treatment step and the repolishing step are listed in Table 3.

TABLE 3

| | The number of LPDs when the heat treatment temperature is varied | | | | |
|---|---|---|---|---|---|
| Heat treatment temperature | not treated | 400° C. | 500° C. | 600° C. | 700° C. |
| Mirror-polished wafer I | 47 | 6 | 3 | 2 | 4 |
| Mirror-polished wafer II | 148 | 102 | 4 | 3 | 2 |

As listed in Table 3, in the mirror-polished wafer II of Experimental Example 2, the LPDs were sufficiently reduced at a heat treatment temperature of 500° C., but, under a condition of a heat treatment temperature of 400° C., the number of LPDs was 102/wafer and the LPD reduction effect was insufficient. The reason is considered as follows: the rate of diffusion of Ni in the silicon wafer was relatively slow and Ni could not move to the silicon wafer surface to a sufficient degree at a heat treatment temperature below 500° C. In the mirror-polished wafer I of Experimental Example 1, even when the heat treatment temperature was 400° C., the number of LPDs was sufficiently reduced to 6/wafer after heat treatment and repolishing. The reason is considered as follows: the rate of diffusion of Cu in the silicon wafer was very fast, and Cu easily moved to the silicon wafer surface and could be removed by repolishing.

The above description revealed that, if a defect caused by Ni was found after heat treatment was performed at a heat treatment temperature of 400° C., it was necessary to perform additional high-temperature heat treatment as adjustments, which results in decreased throughput or the like. That is, to reduce LPDs of a wafer whose heavy-metal contamination state is unknown, a heat treatment temperature of 400° C. is insufficient. It is for this reason that, in the present invention, the heat treatment temperature is set at 500° C. or higher to avoid additional heat treatment and repolishing. On the other hand, at a heat treatment temperature higher than 600° C., a possibility of the generation of slip dislocation due to thermal stress from a wafer supporting section during the heat treatment is increased and failure items caused by high-temperature heat treatment are increased, resulting in a reduction in yields. Thus, in the present invention, the heat treatment temperature was set at 600° C. or lower to avoid these situations.

Experimental Example 10

The LPD Reduction Effect when the Heat Treatment Time is Varied

Next, the LPD reduction effect when the heat treatment time was varied was checked by using the mirror-polished wafers of Experimental Example 1 and Experimental Example 2. The heat treatment temperature was set at 500° C., the amount of repolishing was set at 1.5 μm, and the heat treatment time was set at four levels: 3 hours, 4 hours, 6 hours, and 8 hours. The measurement results of the number of LPDs of the mirror-polished wafers after the heat treatment step and the repolishing step are listed in Table 4. As listed in Table 4, in the mirror-polished wafer II of Experimental Example 2, the LPDs were sufficiently reduced by a heat treatment time of 4 hours or more but 8 hours or less; however, under a condition of a heat treatment time of 3 hours, the number of LPDs was 68/wafer and the LPD reduction effect was insufficient. Moreover, in the mirror-polished wafer I of Experimental Example 1, even when the heat treatment time was 3 hours, the LPDs were 4/wafer, which was a low value.

TABLE 4

| Heat treatment time | not treated | The number of LPDs when the heat treatment time is varied | | | |
|---|---|---|---|---|---|
| | | 3 hours | 4 hours | 6 hours | 8 hours |
| Mirror-polished wafer I | 47 | 4 | 3 | 2 | 3 |
| Mirror-polished wafer II | 148 | 68 | 4 | 1 | 2 |

As in the case with Experimental Example 9, this is caused by the fact that the rate of diffusion of Cu is faster than that of Ni. Since the heavy-metal contamination state is generally unknown, in the present invention, the heat treatment time is set at 4 hours or more to eliminate the need for additional heat treatment and repolishing. On the other hand, the heat treatment time exceeding 6 hours lengthens the step time and reduces production efficiency. Furthermore, if the heat treatment time is more than 6 hours, it has a significant influence on the precipitation characteristics of the interstitial oxygen in the silicon wafer. That is, it affects the BMD (Bulk Micro Defect) characteristics. If a BMD is formed near the wafer surface due to excessive oxygen precipitation, the BMD can be a cause of leakage or the like in a subsequent semiconductor device formation step; therefore, in the present invention, the heat treatment time is set at 6 hour or less to avoid these drawbacks.

Experimental Example 11

The LPD Reduction Effect when the Amount of Repolishing is Varied

Finally, the LPD reduction effect when the amount of repolishing was varied was checked by using the mirror-polished wafers of Experimental Example 1 and Experimental Example 2. The heat treatment temperature was set at 500° C., the heat treatment time was set at 4 hours, and the amount of repolishing was set at four levels: 0.5 μm, 1.0 μm, 1.5 μm, and 2.0 μm. The measurement results of the number of LPDs of the mirror-polished wafers after the heat treatment step and the repolishing step are listed in Table 5. As listed in Table 5, when the amount of repolishing was 1.5 μm or more, the LPDs of the mirror-polished wafers of Experimental Example 1 and Experimental Example 2 were sufficiently reduced, but, when the amount of repolishing was 1.0 μm, the LPDs of the mirror-polished wafer of Experimental Example 2 were not reduced. Therefore, in the present invention, the amount of repolishing was set at 1.5 μm or more to eliminate the need for additional repolishing.

TABLE 5

| The amount of repolishing | not treated | The number of LPDs when the amount of repolishing is varied | | | |
|---|---|---|---|---|---|
| | | 0.5 μm | 1.0 μm | 1.5 μm | 2.0 μm |
| Mirror-polished wafer I | 47 | 32 | 3 | 3 | 3 |
| Mirror-polished wafer II | 148 | 132 | 86 | 4 | 2 |

As described above, by performing the heat treatment step, it is possible to reduce LPDs by making the heavy metals gather near the surface of a silicon wafer subjected to mirror-polishing without reducing yields and by removing the heavy metals with the repolishing step. In particular, such a method can reduce micro LPDs that are about 45 nm in size to a minimum, the micro LPDs that are caused by heavy-metal contamination at the time of crystal growth which can become a cause of generation of LPDs, the micro LPDs that were not able to be removed in the past.

The inventors of the present invention have found out a method for producing a silicon wafer, the method that can produce a silicon wafer at a high yield, the silicon wafer in which LPDs are reduced to a minimum, the silicon wafer with a low failure-incidence rate in the inspection step and the shipment stage, even when a defect-free silicon single crystal is contaminated with heavy metals at the time of growth. Hereinafter, the present invention will be described.

The present invention is a method for producing a silicon wafer from a defect-free silicon single crystal grown by the CZ method, the method comprising: preparing a silicon wafer obtained by slicing the defect-free silicon single crystal and subjected to mirror-polishing; then performing a heat treatment step of subjecting the mirror-polished silicon wafer to heat treatment at a temperature of 500° C. or higher but 600° C. or lower for 4 hours or more but 6 hours or less; and performing a repolishing step of repolishing the silicon wafer after the heat treatment step such that the polishing amount becomes 1.5 μm or more.

[Defect-Free Silicon Single Crystal]

In the present invention, it is possible to grow a defect-free silicon single crystal by the CZ method and, in particular, by the MCZ method that applies a magnetic field. Moreover, in the present invention, the defect-free silicon single crystal is referred to as a silicon single crystal whose entire plane is formed as an N-region containing no void type defect, OSF, and dislocation cluster. In general, in a silicon single crystal, a V-region containing vacancy-type point defects in excess, the vacancy-type point defects generated due to the shortage of silicon atoms, an I-region containing interstitial-type silicon point defects in excess, the interstitial-type silicon point defects generated due to the presence of extra silicon atoms, and, between the V-region and the I-region, an N-region with no (or small) shortage or excess of atoms is present. Then, in a supersaturated state of V or I, a grown-in defect (an FPD, an LSTD, a COP, or the like) is generated.

It is known that the density of both point defects is determined by the relationship between a pulling rate (growth rate) V of a crystal and a temperature gradient G near the interface of solid and liquid phases in the crystal in the CZ method. It is known that, since a parameter V/G determines the total density of point defects, by adjusting the pulling rate in such a way that V/G becomes a predetermined value, it is possible to produce a crystal in which the N-region spreads in the transverse entire plane and, by pulling the crystal while maintaining the pulling rate observed when the N-region has spread transversely, it is possible to extend the crystal whose entire plane is an N-region in a length direction. The defect-free silicon single crystal in the present invention is a silicon single crystal grown in this manner, the silicon single crystal whose entire plane is an N-region.

[Preparation of a Silicon Wafer]

In the present invention, a silicon wafer obtained by at least slicing a defect-free silicon single crystal and performing mirror-polishing on the wafer obtained by slicing is prepared. This wafer processing step is not limited to a particular step, and any commonly-performed step can be applied. In particular, after slicing, chamfering, lapping, etching, and mirror-polishing are typically performed, but other steps may be performed. Moreover, although a silicon wafer is not limited to a particular silicon wafer, it is preferable to prepare a silicon wafer of 300 mm or more in diameter as the silicon wafer obtained by slicing and subjected to mirror-polishing. Even with such a large-diameter wafer used in a leading-edge product, it is possible to produce a high-quality silicon wafer in which LPDs are reduced by performing the heat treatment step and the repolishing step of the present invention.

[Heat Treatment Step]

In the heat treatment step of the present invention, heat treatment is performed on a mirror-polished silicon wafer at a temperature of 500° C. or higher but 600° C. or lower for 4 hours or more but 6 hours or less. As described above, by performing the relatively low-temperature heat treatment step by using the fact that the rates of diffusion of heavy metals, in particular, Cu and Ni, in the silicon single crystal are fast, it is possible to make Cu and Ni gather near the surface of the silicon wafer subjected to mirror-polishing. A heat treatment furnace used is not limited to a particular heat treatment furnace, and using a vertical or horizontal batch furnace increases efficiency.

Here, with consideration given to the fact that the contamination state, such as which heavy metal causes contamination, is unknown, the heat treatment temperature is set at 500° C. or higher to eliminate the need for additional heat treatment. Moreover, the heat treatment temperature is set at 600° C. or lower to avoid an increase in the possibility of slip dislocation due to thermal stress from a wafer-supporting section during the heat treatment, an increase in failure items caused by the heat treatment, and a resultant reduction in yields. Moreover, with consideration given to the fact that the contamination state is unknown, the heat treatment time is set at 4 hours or more to eliminate the need for additional heat treatment and at 6 hours or less to prevent a reduction in production efficiency and a harmful effect on the BMD characteristics or the like.

[Repolishing Step]

In the repolishing step of the present invention, the silicon wafer after the heat treatment step is repolished such that the amount of polishing becomes 1.5 µm or more. As described above, by removing the heavy metals, in particular, Cu and Ni, gathering near the surface of the silicon wafer by the repolishing step, it is possible to remove the heavy metals that become a cause of generation of LPDs. This makes it possible to reduce micro LPDs caused by heavy metals. Here, the amount of repolishing is set at 1.5 µm or more to eliminate the need for additional repolishing. As a polishing method, any polishing method that is commonly performed on a silicon wafer can be used and the polishing method is not limited to a particular method. For example, CMP using colloidal silica as a polishing agent can be performed.

As described above, by performing the heat treatment step and the repolishing step, a method for producing a high-yield silicon wafer is obtained, the silicon wafer in which LPDs are reduced to a minimum, the silicon wafer with a low failure-incidence rate in the inspection step and the shipment stage at the time of production of a silicon wafer, even when a defect-free silicon single crystal is contaminated with heavy metals at the time of growth.

Moreover, by performing the heat treatment step and the repolishing step, it is possible to produce the silicon wafer in which the number of LPDs that are 37 nm or more but 120 nm or less in particle diameter size, the LPDs detected by the particle counter, is 10/wafer or less. As described above, when the LPDs are reduced, it is possible to produce, at a high yield, a silicon wafer with a lower failure-incidence rate in the inspection step and the shipment stage.

[Silicon Wafer]

Moreover, a silicon wafer produced by the method for producing a silicon wafer is a silicon wafer best suited for production of a wafer for step checking that is used in a leading-edge semiconductor device fabrication step and production of a high-integration semiconductor device because, even when a defect-free silicon single crystal is contaminated with heavy metals at the time of growth, LPDs are reduced to a minimum and the failure-incidence rate in the inspection step and the shipment stage is lowered.

Furthermore, in the present invention, it is possible to obtain a silicon wafer obtained as a mirror-polished silicon wafer repolished after heat treatment, the silicon wafer in which the number of LPDs that are 37 nm or more but 120 nm or less in particle diameter size, the LPDs detected by the particle counter, is 10/wafer or less. In such a silicon wafer, the failure-incidence rate in the inspection step and the shipment stage is lowered because the LPDs are reduced to a minimum; therefore, such a silicon wafer is a silicon wafer suited for production of a wafer for step checking that is used in a leading-edge semiconductor device fabrication step and production of a high-integration semiconductor device.

Moreover, it is preferable that the diameter of the silicon wafer is 300 mm or more. Such a large-diameter wafer for a leading-edge product is a silicon wafer best suited for production of a wafer for step checking that is used in a semiconductor device fabrication step and production of a high-integration semiconductor device.

EXAMPLES

Hereinafter, the present invention will be described in more detail with examples and comparative examples of the present invention, but the present invention is not limited to the examples described below.

Example 1

A defect-free silicon single crystal of 300 mm in diameter was grown by filling a quartz crucible of 810 mm in diameter with 410 kg of polycrystalline silicon and controlling a temperature gradient (G) in a boundary region between a solid phase/a liquid phase of silicon and a growth rate (V). In doing so, boron doping was performed so that the resistivity became 10 Ω·cm, and the crystal axis orientation was set at <100>. Slicing, chamfering, lapping, etching, and mirror-polishing were performed on this defect-free silicon single crystal, whereby a mirror-polished wafer was produced. Heat treatment was performed on this mirror-polished wafer in a nitrogen atmosphere at a heat treatment temperature of 500° C. for a heat treatment time of 4 hours, and then repolishing was performed by setting the amount of repolishing at 1.5 µm, whereby a silicon wafer was produced. An LPD of the silicon wafer after heat treatment and repolishing was detected by a particle counter (KLA-Tencor Corporation Model name=SP2 Detection particle diameter size: 0.037 µm or more). The detection result is listed in Table 6.

Example 2

Heat treatment at a heat treatment temperature of 600° C. for a heat treatment time of 4 hours was performed on the mirror-polished wafer produced in the same manner as in Example 1, and repolishing was performed by setting the amount of repolishing at 1.5 µm, whereby a silicon wafer was produced. The LPD detection result is listed in Table 6.

Example 3

Heat treatment at a heat treatment temperature of 500° C. for a heat treatment time of 6 hours was performed on the mirror-polished wafer produced in the same manner as in Example 1, and repolishing was performed by setting the amount of repolishing at 1.5 µm, whereby a silicon wafer was produced. The LPD detection result is listed in Table 6.

Example 4

Heat treatment at a heat treatment temperature of 500° C. for a heat treatment time of 4 hours was performed on the mirror-polished wafer produced in the same manner as in Example 1, and repolishing was performed by setting the amount of repolishing at 2.0 µm, whereby a silicon wafer was produced. The LPD detection result is listed in Table 6.

Comparative Example 1

Heat treatment at a heat treatment temperature of 400° C. for a heat treatment time of 4 hours was performed on the mirror-polished wafer produced in the same manner as in Example 1, and repolishing was performed by setting the amount of repolishing at 1.5 µm, whereby a silicon wafer was produced. The LPD detection result is listed in Table 6.

Comparative Example 2

Heat treatment at a heat treatment temperature of 700° C. for a heat treatment time of 4 hours was performed on the mirror-polished wafer produced in the same manner as in Example 1, and repolishing was performed by setting the amount of repolishing at 1.5 µm, whereby a silicon wafer was produced. The LED detection result is listed in Table 6.

Comparative Example 3

Heat treatment at a heat treatment temperature of 500° C. for a heat treatment time of 3 hours was performed on the mirror-polished wafer produced in the same manner as in Example 1, and repolishing was performed by setting the amount of repolishing at 1.5 µm, whereby a silicon wafer was produced. The LPD detection result is listed in Table 6.

Comparative Example 4

Heat treatment at a heat treatment temperature of 500° C. for a heat treatment time of 8 hours was performed on the mirror-polished wafer produced in the same manner as in Example 1, and repolishing was performed by setting the amount of repolishing at 1.5 µm, whereby a silicon wafer was produced. The LED detection result is listed in Table 6.

Comparative Example 5

Heat treatment at a heat treatment temperature of 500° C. for a heat treatment time of 4 hours was performed on the mirror-polished wafer produced in the same manner as in Example 1, and repolishing was performed by setting the amount of repolishing at 1.0 µm, whereby a silicon wafer was produced. The LED detection result is listed in Table 6.

TABLE 6

|  | Examples | | | | Comparative Examples | | | | |
| --- | --- | --- | --- | --- | --- | --- | --- | --- | --- |
|  | 1 | 2 | 3 | 4 | 1 | 2 | 3 | 4 | 5 |
| Heat treatment temperature (° C.) | 500 | 600 | 500 | 500 | 400 | 700 | 500 | 500 | 500 |
| Heat treatment time (hours) | 4 | 4 | 6 | 4 | 4 | 4 | 3 | 8 | 4 |
| The amount of repolishing (µm) | 1.5 | 1.5 | 1.5 | 2 | 1.5 | 1.5 | 1.5 | 1.5 | 1 |
| The number of LPDs | 4 | 3 | 1 | 2 | 102 | 2 | 68 | 2 | 86 |

TABLE 6-continued

| | Examples | | | | Comparative Examples | | | | |
|---|---|---|---|---|---|---|---|---|---|
| | 1 | 2 | 3 | 4 | 1 | 2 | 3 | 4 | 5 |
| Harmful effect by heat treatment and repolishing steps | None | None | None | None | None | Reduction in good chip yield | None | Prolonged step | None |

As described above, in Comparative Example 1 in which the heat treatment temperature was low, LPDs could not be reduced because the impurity which became a cause of LPDs did not diffuse to the surface adequately, and, in Comparative Example 2 in which the heat treatment temperature was high, good chip yield was reduced due to the heat treatment. Moreover, in Comparative Example 3 in which the heat treatment time was short, LPDs could not be reduced because the impurity which became a cause of LPDs did not diffuse to the surface adequately, and, in Comparative Example 4 in which the heat treatment time was long, throughput was decreased because the entire step was prolonged. Furthermore, it was revealed that, in Comparative Example 5 in which the amount of repolishing was small, the impurity which became a cause of LPDs could not be removed to a satisfactory extent and LPDs could not be reduced adequately.

On the other hand, Examples 1 to 4 of the present invention revealed that, by performing the heat treatment step at a relatively low temperature of 500 to 600° C. for 4 to 6 hours by using the fact that the rates of diffusion of heavy metals, in particular, Cu and Ni, in the silicon single crystal were fast, it was possible to make the heavy metals gather near the surface of the silicon wafer subjected to mirror-polishing. Moreover, Examples 1 to 4 revealed that it was possible to reduce LPDs by removing the heavy metals by the repolishing step in which the amount of polishing was 1.5 μm or more.

The above description revealed that the method of the present invention for producing a silicon wafer was a method by which a silicon wafer could be produced at a high yield, the silicon wafer in which LPDs were reduced to a minimum, the silicon wafer with a low failure-incidence rate in the inspection step and the shipment stage, even when a defect-free silicon single crystal was contaminated with heavy metals at the time of growth.

Moreover, a silicon wafer of the present invention is a silicon wafer best suited for production of a wafer for step checking that is used in a leading-edge semiconductor device fabrication step and production of a high-integration semiconductor device, the silicon wafer in which LPDs are reduced to a minimum, the silicon wafer with a low failure-incidence rate in the inspection step and the shipment stage.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a silicon wafer from a defect-free silicon single crystal grown by a Czochralski (CZ) method, the method comprising:
    preparing the silicon wafer obtained by slicing the defect-free silicon single crystal and subjected to mirror-polishing; then
    performing a heat treatment step of subjecting the mirror-polished silicon wafer to heat treatment at a temperature of 500° C. or higher but 600° C. or lower for 4 hours or more but 6 hours or less; and
    performing a repolishing step of repolishing the silicon wafer after the heat treatment step such that a polishing amount becomes 1.5 μm or more, wherein
    by performing the heat treatment step and the repolishing step, the silicon wafer in which the number of Light Point Defects (LPDs) that are 37 nm or more but 120 nm or less in particle diameter size, the LPDs detected by a particle counter, is 10/wafer or less is produced.

2. The method for producing a silicon wafer according to claim 1, wherein
    as the silicon wafer obtained by slicing and subjected to mirror-polishing, a silicon wafer of 300 mm or more in diameter is prepared.

* * * * *